(12) United States Patent
Bojarczuk, Jr. et al.

(10) Patent No.: US 7,078,301 B2
(45) Date of Patent: Jul. 18, 2006

(54) RARE EARTH METAL OXIDE MEMORY ELEMENT BASED ON CHARGE STORAGE AND METHOD FOR MANUFACTURING SAME

(75) Inventors: Nestor A. Bojarczuk, Jr., Poughkeepsie, NY (US); Eduard Albert Cartier, Leuven (BE); Supratik Guha, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/954,275

(22) Filed: Oct. 1, 2004

(65) Prior Publication Data

US 2005/0047252 A1    Mar. 3, 2005

Related U.S. Application Data

(62) Division of application No. 10/042,181, filed on Jan. 11, 2002, now Pat. No. 6,894,338.

(51) Int. Cl.
*H01L 21/336* (2006.01)

(52) U.S. Cl. ...................... 438/287; 438/197
(58) Field of Classification Search ............... 438/197, 438/287, 3, 297
See application file for complete search history.

(56) References Cited

U.S. PATENT DOCUMENTS

| | | | |
|---|---|---|---|
| 6,504,214 B1 | 1/2003 | Yu et al. | |
| 6,541,280 B1 * | 4/2003 | Kaushik et al. | 438/3 |
| 6,548,855 B1 * | 4/2003 | Ramsbey et al. | 257/314 |
| 6,753,567 B1 * | 6/2004 | Maria et al. | 257/310 |
| 2002/0115252 A1 | 8/2002 | Haukka et al. | |
| 2002/0137317 A1 | 9/2002 | Kaushik et al. | |
| 2002/0142536 A1 | 10/2002 | Zhang et al. | |
| 2002/0151142 A1 | 10/2002 | Callegari et al. | |
| 2002/0164850 A1 | 11/2002 | Gnadinger et al. | |
| 2003/0060018 A1 * | 3/2003 | Hsu | 438/424 |
| 2003/0124871 A1 * | 7/2003 | Arghavani et al. | 438/763 |
| 2003/0136331 A1 * | 7/2003 | Ami et al. | 117/2 |

OTHER PUBLICATIONS

U.S. Appl. No. 09/913,723 filed Aug. 17, 2001 entitled "Microelectric Device for Storing Information and Method Thereof.".

Chon et al. "Fatigue free samarium-modified bismuth titanate film capacitors having large spontaneous polarizations", November Applied Physics Letters, vol. 79 No. 10 pp. 3137-3139.

* cited by examiner

*Primary Examiner*—Bradley K. Smith
(74) *Attorney, Agent, or Firm*—Wan Yee Cheung, Esq.; McGinn IP Law Group, PLLC

(57) ABSTRACT

A data storage element (and method of forming the same) includes a substrate comprising a semiconductor material, a metal oxide layer including an electrically insulating rare earth metal oxide disposed upon a surface of the substrate, a conductive material disposed upon the metal oxide layer, a first electrode electrically connected to the conductive material, and a second electrode connected to the substrate.

19 Claims, 4 Drawing Sheets

RARE EARTH METAL OXIDE MEMORY ELEMENT BASED ON CHARGE STORAGE AND METHOD FOR MANUFACTURING SAME

The present Application is a Divisional Application of U.S. Pat. application Ser. No. 10/042,181 filed on Jan. 11, 2002, now U.S. Pat. No. 6,894,338.

BACKGROUND OF THE INVENTION

1. Field of the Invention

The present invention generally relates to a memory element, and more particularly to a rare earth metal oxide memory element based on charge storage and method for manufacturing the same.

2. Description of the Related Art

In conventional semiconductor structures, when a voltage ramp is applied to a structure having a metal film interposed between two electrodes, beyond a threshold voltage, there is an accumulation of charge in the metal film, giving rise to a shift in the current voltage and capacitance voltage characteristics. Upon reversal of this voltage, beyond a certain threshold, the charge in the film is discharged, leading to the original I-V (current voltage) and C-V (capacitance voltage) requirements being restored.

However, there is a need for a non-volatile memory where the charging voltage requirements are low (<7 V), charge retention times are long, and the processing technology is compatible with standard CMOS processing such as aluminum metallurgy. Prior to the invention, such a structure has not been developed.

SUMMARY OF THE INVENTION

In view of the foregoing and other problems, drawbacks, and disadvantages of the conventional methods and structures, it is an object of the present invention to provide a memory storage device (and method of forming the same), the active part of which is a metal oxide insulator thin film containing one or more constituent metals, which is connected to two electrodes.

In a first aspect of the invention, a data storage element (and method of forming the same) includes a substrate comprising a semiconductor material, a metal oxide layer comprising an electrically insulating rare earth metal oxide disposed upon a surface of the substrate, a conductive material disposed upon the metal oxide layer, a first electrode electrically connected to the conductive material, and a second electrode connected to the substrate.

In a second aspect, a data storage element includes a substrate including a semiconductor material having a source region and a drain region formed in a surface of the substrate, a layer of metal oxide disposed upon the surface of the substrate and between the source region and the drain region, the metal oxide including at least one metal which has a plurality of oxidation states, a conductive layer disposed upon the layer of metal oxide, a first electrode electrically connected to the conductive layer, a second electrode connected to the source region, and a third electrode connected to the drain region.

In a third aspect, a memory includes a rare-earth based memory element using hysteresis and current-voltage characteristics thereof to store data.

In an exemplary implementation, the metal oxide may be a compound lanthanum oxide and a mixed lanthanum aluminum oxide.

With the invention, when a voltage is applied between the electrodes, beyond a threshold voltage, charge is accumulated in the film, giving rise to a shift in the current voltage and capacitance voltage characteristics. Upon reversal of this voltage, beyond a certain threshold, the charge in the film is discharged, leading to the original I-V and C-V requirements being restored.

With the novel structure of the invention, as compared to the conventional structures described above, charging voltage requirements are low (<7 V), charge retention times are long, and the processing technology is compatible with standard CMOS processing such as aluminum metallurgy.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 2:
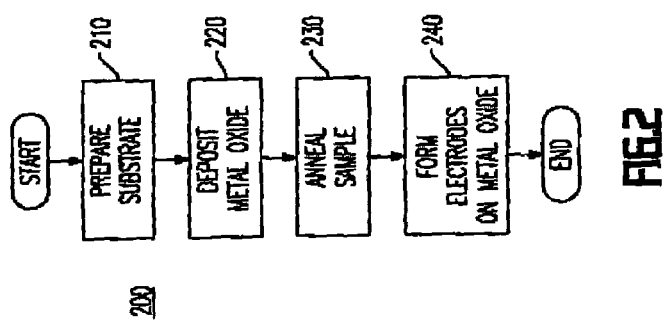
FIG. 2 illustrates a flowchart of a method 200 of forming the inventive structure according to the present invention.

Referring now to the drawings, and more particularly to FIGS. 1A–9, there are shown preferred embodiments of the method and structures according to the present invention.

Figure 1A:
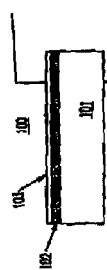
FIGS. 1A–1C illustrate a structure 100 according to the present invention.
Figure 1B:
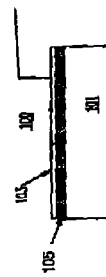
Figure 1C:
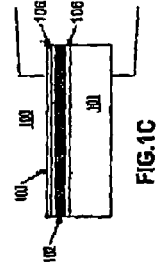

Turning now to FIG. 1A, a structure of a memory element 100 of the present invention is shown.

In FIG. 1A, the inventive structure includes a substrate 101 (e.g., silicon or the like). A metal oxide gate 102 is formed on the surface of the substrate 101 and an electrode 103 made of metal, a heavily doped semiconductor or the like (e.g., aluminum, polysilicon, etc.) is formed on the metal oxide.

Preferably, the film 102 is formed of a lanthanum oxide, lanthanum aluminum oxide, or any other rare earth oxide (including Yttrium oxide) or rare earth oxide mixed in with another host oxide deposited onto a silicon wafer. Film thicknesses can be in the range of about 10 Å to about 10,000 Å and more particularly from about 50 Å to about 500 Å. In a practical implementation, the metal oxide layer was formed to have a thickness in a range of about 15 to about 18 nm.

In the inventive process 200 (as shown in FIG. 2), first in step 210, the substrate (e.g., silicon substrate 101) is taken/prepared.

In step 220, the metal oxide film (e.g., film 102) is deposited on the substrate 101. Any deposition technique can be used. In a practical implementation, the deposition was performed by molecular beam deposition where an atomic oxygen beam along with a lanthanum and aluminum beam were directed on a Si sample (e.g., the substrate 101) in an ultra high vacuum chamber at approximately 550 C.

After deposition, in step 230, the sample was annealed in forming gas at approximately 550 C.

Then, in step 240, aluminum electrodes (e.g., electrode 103) were evaporated onto front side of the structure. The doped Si wafer (e.g., substrate 101) was used as the bottom electrode. The completed structure of the inventive memory element 100 is as shown in FIG. 1A.

Preferably, the metal oxide layer is lanthanum oxide or lanthanum-aluminum oxide. This oxide layer can be homogenously mixed in with a host oxide such as silicon oxide (e.g., layer 105 in FIG. 1B), or sandwiched between layers 106 of the host oxide (e.g., FIG. 1C).

As shown in the graphs of FIGS. 4–8 described below, as the voltage exceeds a threshold voltage (>4 V), the film accumulates charge and on ramping the voltage down, there is a shift in the current minima (e.g., as the device goes from inversion to depletion to accumulation) as a function of voltage due to the change in the internal field as a result of the charging.

The metal oxide film (e.g., 102) can be discharged on reversing the voltage and then, as can be observed, the position of the quasistatic dip returns to its original value. The device can be flipped continuously without deterioration or shift in the I-Vs (current voltages). The charging time at 6.2 V is about 3 ms. Charging occurs from about 3.5 V, but charging/discharging times are much longer. Charge retention times were measured to be as long as 12 hours.

Figure 5:
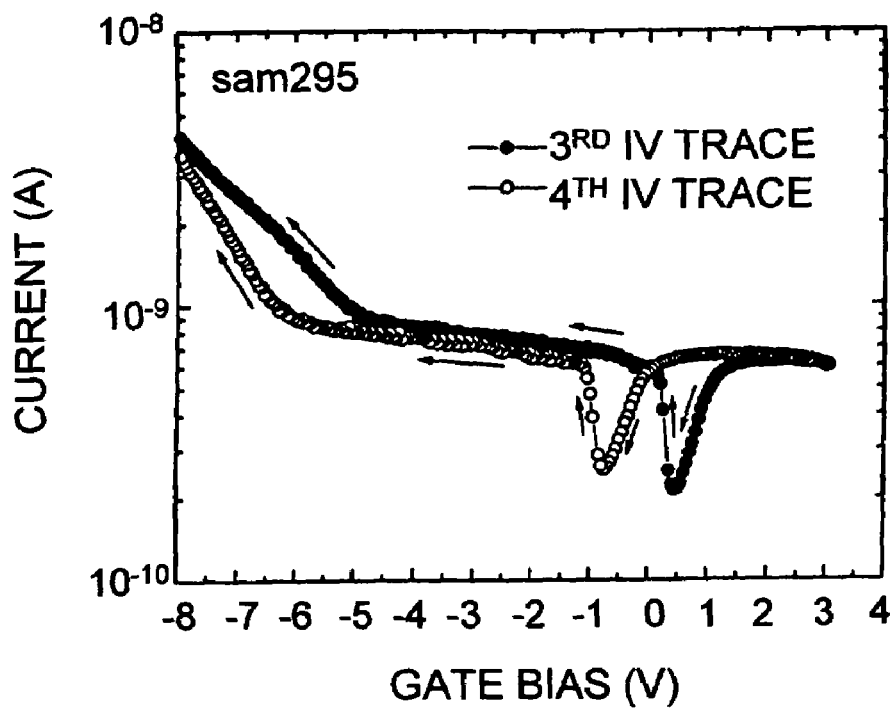

FIG. 5 (described in further detail below) shows the C-V (capacitance voltage) characteristics and the hysteresis shows the charging of the film. It is believed that the charging/discharging of the film is due to the switching of some of the La ions between different oxidation states (i.e., from La+2 to La+3 and vice versa). Thus, other metals (e.g., Ce, Pr, etc.) with multiple oxidation states should also work. The flipping is due to the redox reactions. La+3+e La+2, and La+3+h=La+2, as electrons and holes are injected into the thin film. These La ions could be ions in their substitutional site, or ions in positions that could be characterized as defects, or ions that form complexes with other defects. Such an insulator could be used as a gate of a transistor that would form a read/write memory element, as shown in FIG. 3.

Figure 3:
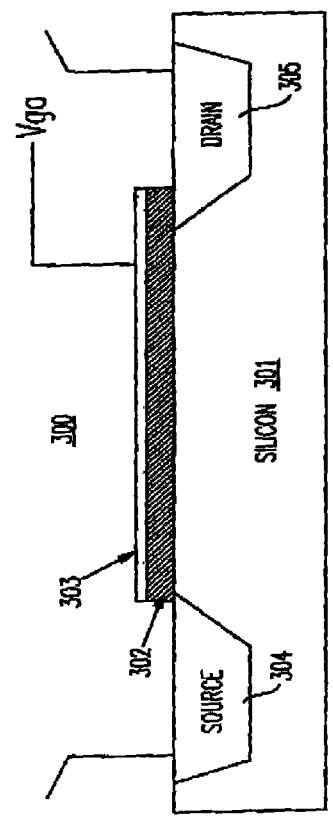
FIG. 3 illustrates another structure 200 according to the present invention.

That is, FIG. 3 illustrates another example of the structure of the inventive memory element 300 which includes a substrate 301 (e.g., silicon or the like) in which source and drain regions 304, 305 have been formed. A metal oxide gate 302 is formed on the surface of the substrate 301 between the source and drain regions 304, 305. An electrode 303 is subsequently formed on the metal oxide layer 302.

FIGS. 4–8 illustrate the switching behavior of the material. That is, in FIG. 4, two current-voltage (I-V) traces measured on an Al gate capacitor with an area of 5×10-3 cm$^2$ are shown.

These traces were measured with a ramp rate of 0.1 V/sec. The first trace with solid (dark) symbols shows a dip in the current located at about −1.25 V. The dip occurs in the voltage range where the silicon substrate (e.g., substrates 101, 301) goes from inversion through depletion into accumulation. At +3 V, the current starts to sharply increase above the value of the roughly constant charging current of the capacitor given by C*dV/dt, where C is the capacitance. Then, the current levels off again around +4 V before increasing exponentially above about 5 V.

Figure 4:
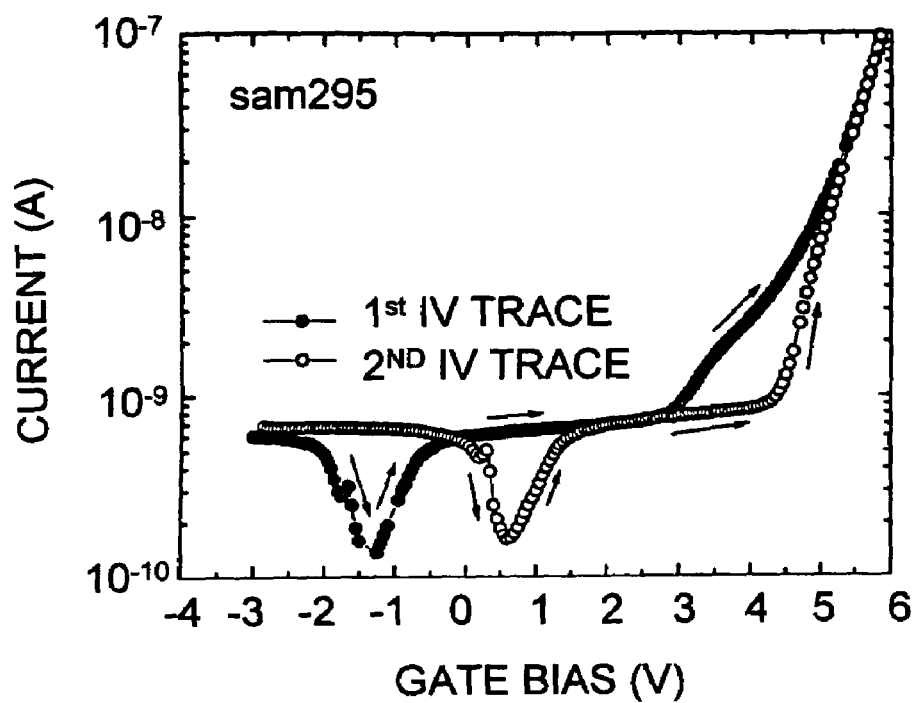
FIGS. 4–9 are graphs illustrating the switching behavior of the material.

After the first I-V trace, a second trace is measured as shown by the open symbols. Two main differences can be observed. First, the dip due to the silicon capacitance is shifted to −0.5 V and the current increase at +3 V with the leveling around 4 V is completely absent. The current sharply rises at about 4.5 V and follows an exponential behavior. FIG. 4 clearly shows that a switching behavior in the capacitance voltage characteristics (in this FIG. measured as a dip in the current) from −1.25 V to 0.75 V has occurred.

In FIG. 5, two additional current-voltage (I-V) traces measured on the same capacitor as used for taking the data in FIG. 4 are shown. These traces were measured with a ramp rate of −0.1 V/sec. The absolute magnitude of the current is shown in FIG. 4 because all currents are negative. (Since the measurements were performed with n-type silicon, the sample was exposed to white light during the measurements. This was done to enhance minority carrier generation and to prevent the silicon from going into deep depletion. Other methods can be used to achieve that same effect such as implanting the silicon surrounding the capacitor with n-type dopants.)

The third trace shown with solid (dark) symbols again shows a dip in the current located at about −1.25 V. The dip occurs in the voltage range where the silicon substrate goes from accumulation through depletion into inversion. At −5.5 V, the current starts to sharply increase above the value of the roughly constant charging current of the capacitor given by C*dV/dt, where C is the capacitance. The current then levels off again around +7 V before increasing again about −7.5 V.

After the third trace, a fourth I-V trace is measured as shown by the open symbols. Two main differences can be observed.

First, the dip due to the silicon capacitance is shifted to about −1.0 V and the current increase at −5.5 V with the leveling around −7 V is completely absent. The current sharply rises at about −7.0 V and follows an exponential behavior.

FIG. 5 clearly shows that a switching behavior in the capacitance voltage characteristics (in FIG. 5 measured as a dip in the current) from about 0.75 V to −1.0 V has occurred.

Combining the results FIG. 4 and FIG. 5, it can be seen that the capacitance voltage characteristics can be switched from about −1 V to about +1 V with such current ramp experiments reversibly (i.e., the capacitance value at a certain voltage can be controllably placed at one of two different values). As a result, this device can be used as a memory device.

Figure 6:
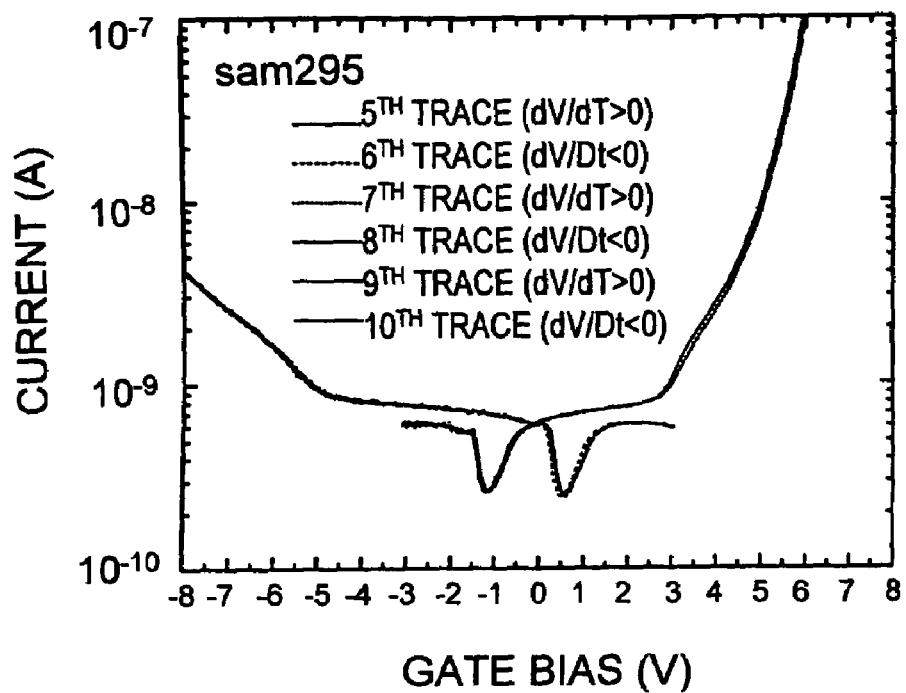

In FIG. 6, traces 5 through 10 are shown. Here, the direction has been altered from trace to trace to show application to a memory usage. As can be seen, all traces with dV/dt>0 display the dip due to the silicon surface capacitance at about −1 V, while all the traces with a dV/dt<0 display the dip due to the silicon surface capacitance at −0.75 V. Repeated switching is possible by alternating the voltage ramp from positive to negative voltages.

Figure 7:
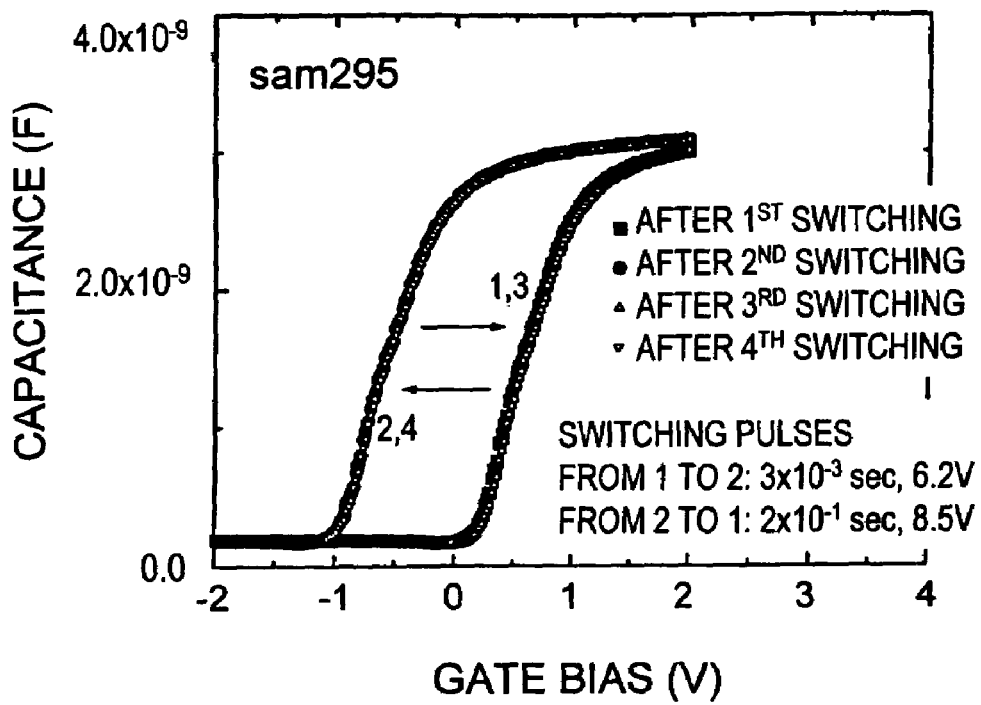

FIG. 7 illustrates that this switching behavior can also be observed by applying voltage pulses to the capacitor structure. In this case, the high frequency capacitance voltage characteristics was measured after applying a positive pulse of 6.2 V with a width of 0.003 sec to a fresh capacitor (e.g., shown by solid squares in FIG. 7).

Then, a negative pulse of −8.5 V of 0.2 sec was applied and the capacitance voltage characteristics shown by the solid circles was measured. The up triangles show the C-V trace after a second (3rd switching) positive pulse as described above. Then, the C-V was measured after a second negative pulse.

Figure 8:
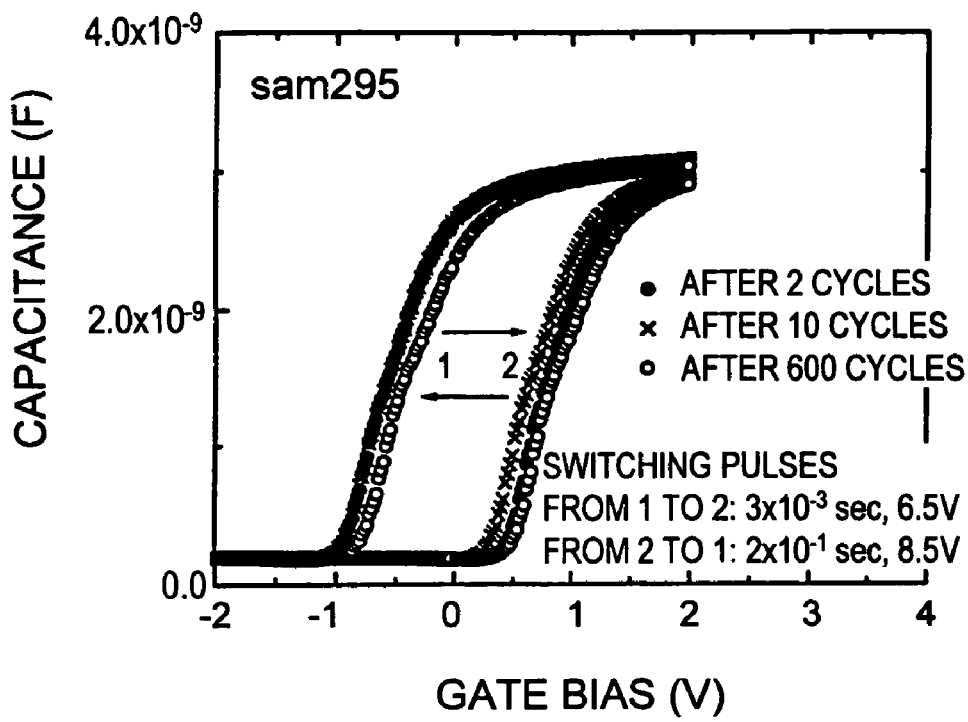

FIG. 8 shows that the switching of the CV characteristics can be maintained over repeated cycles (e.g., positive and negative pulses as described above) over a number of cycles.

Figure 9:
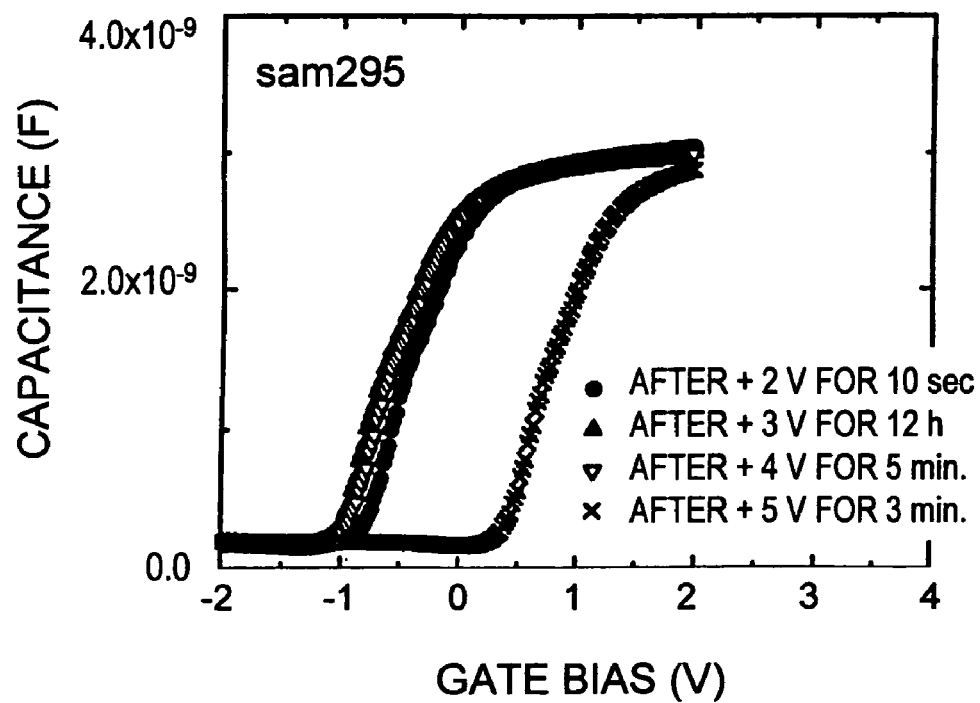

FIG. 9 shows that the structure stays in the switched state for extended periods of time. The solid circles show the C-V measured 10 sec. after applying a negative pulse. During that time the device was held at +2 V. Traces were measured after holding the structure at +3 V for 12 h, +4 V for 5 min and +5 V for 3 min. As can be seen, at voltages of less than 3 V, no significant shift in the CV curve occurs within 12 hours. Only at higher voltages (+5 V for 3 min.) is the device switched to the position observed after applying a positive pulse as described above.

With the unique and unobvious features of the present invention, a non-volatile memory (and method of forming the memory) is provided where the charging voltage requirements are low (<7 V), charge retention times are long, and the processing technology is compatible with standard CMOS processing such as aluminum metallurgy. As a result, when a voltage is applied between the electrodes, beyond a threshold voltage, charge is accumulated in the film, giving rise to a shift in the current voltage and capacitance voltage characteristics. Upon reversal of this voltage, beyond a certain threshold, the charge in the film is discharged, thereby leading to the original I-V and C-V requirements being restored.

While the invention has been described in terms of preferred embodiments, those skilled in the art will recognize that the invention can be practiced with modification within the spirit and scope of the appended claims.

What is claimed is:

1. A method of forming a data storage element, said method comprising:
    forming a metal oxide layer on a substrate, said metal oxide layer comprising an electrically insulating rare earth metal oxide disposed upon a surface of said substrate;
    disposing a conductive material comprising metallic aluminum upon said metal oxide layer;
    electrically connecting a first electrode to said conductive material; and
    connecting a second electrode to said substrate,
    wherein said metal oxide layer has a thickness in a range from 50 Å to 500 Å,
    wherein said metal oxide layer comprises an active layer on which a charge is accumulated when a voltage greater than a threshold voltage is applied between said first and second electrodes.

2. The method of claim 1, wherein said metal oxide comprises lanthanum oxide.

3. The method of claim 1, wherein said metal oxide comprises a mixture of lanthanum oxide and aluminum oxide.

4. The method of claim 3, wherein said disposing said conductive material comprises forming a layer of said metallic aluminum directly on said metal oxide layer.

5. The method of claim 1, wherein said metal oxide comprises at least one of:
    lanthanum oxide, and
    a mixture of lanthanum oxide and aluminum oxide.

6. The method of claim 1, wherein said metal oxide layer has a thickness of 150Å to 180 Å.

7. The method of claim 1, wherein said substrate comprises n-doped silicon.

8. The method of claim 1, wherein said forming said metal oxide layer comprises depositing said metal oxide layer using a molecular beam deposition in which an atomic oxygen beam and a lanthanum and aluminum beam are directed on said substrate.

9. The method of claim 8, wherein said forming said metal oxide layer is performed in an ultra high vacuum chamber at approximately 550° C.

10. The method of claim 1, forther comprising:
    after said forming said metal oxide layer, annealing said metal oxide layer and said substrate in a forming gas at approximately 550° C.

11. The method of claim 1, wherein said forming said metal oxide layer comprises forming a host oxide layer, said metal oxide layer being homogeneously mixed with said host oxide layer.

12. The method of claim 1, further comprising:
    forming a plurality of host oxide layers, said metal oxide layer being formed between said plurality of host oxide layers.

13. The method of claim 1, wherein metal oxide layer comprises one of a cerium oxide layer, a yttrium oxide layer, and a praseodymium oxide layer.

14. The method of claim 1, wherein said metal oxide layer comprises a lanthanum aluminum oxide layer.

15. A method of forming a data storage element, said method comprising:
    forming source and drain regions in an n-doped silicon substrate;
    forming a lanthanum aluminum oxide layer having a thickness in a range from 50 Å to 500Å on said substrate and between source and drain regions;
    forming an aluminum layer on said lanthanum aluminum oxide layer;
    electrically connecting a first electrode to said aluminum layer;
    connecting a second electrode to said source region; and
    connecting a third electrode to said drain region,
    wherein said metal oxide layer comprises an active layer on which a charge is accumulated when a voltage greater than a threshold voltage is applied between said first and second electrodes.

16. A method of storing data, comprising:
    providing a data storage element comprising a substrate, a metal oxide layer formed on said substrate, a first electrode connected to said metal oxide layer, and a second electrode connected to said substrate; and
    applying a voltage between said first and second electrodes to one of charge and discharge said metal oxide layer, to thereby switch a capacitance voltage characteristic of said data storage element.

17. The method of claim 16, wherein said applying said voltage comprises applying a voltage between said first and second electrodes to cause a charge to accumulate in said metal oxide layer.

18. The method of claim 17, wherein said applying said voltage further comprises reversing said voltage applied between said first and second electrodes to discharge said metal oxide layer.

19. The metbod of claim 16, wherein data is stored in said data storage element based on a value of said capacitance voltage characteristic.

* * * * *